United States Patent [19]
Makowiecki et al.

[11] Patent Number: 5,333,726
[45] Date of Patent: Aug. 2, 1994

[54] MAGNETRON SPUTTERING SOURCE

[75] Inventors: Daniel M. Makowiecki, Livermore, Wash.; Mark A. McKernan, Livermore, Calif.; R. Fred Grabner, Brentwood, Calif.; Philip B. Ramsey, Livermore, Calif.

[73] Assignee: Regents of the University of California, Oakland, Calif.

[21] Appl. No.: 5,122

[22] Filed: Jan. 15, 1993

[51] Int. Cl.⁵ .............................................. C23C 14/35
[52] U.S. Cl. .......................... 204/298.09; 204/298.11; 204/298.12; 204/298.19
[58] Field of Search ...................... 204/298.09, 298.11, 204/298.12, 298.19

[56] References Cited
U.S. PATENT DOCUMENTS 4,515,675  5/1985  Kieser et al. .................... 204/298.12
4,569,745  2/1986  Nagashima ...................... 204/298.12

Primary Examiner—Aaron Weisstuch
Attorney, Agent, or Firm—L. E. Carnahan; Henry P. Sartorio; Danny C. Halverson

[57] ABSTRACT

A magnetron sputtering source for sputtering coating substrates includes a high thermal conductivity electrically insulating ceramic and magnetically attached sputter target which can eliminate vacuum sealing and direct fluid cooling of the cathode assembly. The magnetron sputtering source design results in greater compactness, improved operating characteristics, greater versatility, and low fabrication cost. The design easily retrofits most sputtering apparatuses and provides for safe, easy, and cost effective target replacement, installation, and removal.

37 Claims, 6 Drawing Sheets

MAGNETRON SPUTTERING SOURCE

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

This invention relates generally to vacuum sputter coating apparatus, and more particularly to planar magnetron sputtering source designs.

2. Description of Related Art

Cathodic sputtering refers to the erosion of a cathode by ion bombardment that occurs when an electrical discharge is passed between electrodes in a low pressure gas. In the sputtering process inert gas ions with a positive charge are accelerated from the glow discharge, that forms between the electrodes, to the negative cathode. Erosion results from the ejection of atoms and clusters of atoms from the cathode surface as a result of momentum transfer from the bombarding ions. Some of the ejected cathode material condenses on surfaces surrounding the cathode. Sputtering becomes a coating process when the ejected material is deliberately condensed on a substrate suitably positioned near the cathode.

Sputtering is a vacuum coating process where an electrically isolated cathode is mounted in a chamber that can be evacuated and partially filled with an inert gas. If the cathode material is an electrical conductor, a direct-current high-voltage power supply is used to apply the high voltage potential. If the cathode is an electrical insulator, the polarity of the electrodes must be reversed at very high frequencies to prevent the formation of a positive charge on the cathode that would stop the ion bombardment process. Since the electrode polarity is reversed at a radio frequency of 13.56 MHz, this process is referred to as RF-sputtering.

Magnetron sputtering is a more efficient form of diode sputtering that uses a magnetic field to trap electrons in a region near the target surface, thereby creating a higher probability of ionizing a gas atom. The high density of ions created near the target surface causes material to be removed many times faster than in diode sputtering. The magnetron effect is created by an array of permanent magnets included within the cathode assembly that produce a magnetic field normal to the electric field.

Ion bombardment not only causes atoms of the target material to be ejected, but it also imparts considerable thermal energy to the target. Consequently, any target attachment scheme must provide for good physical contact to the cathode assembly to allow adequate thermal transfer of the target's heat to the cooling media or away from the sputtering source. This is particularly true in the case of magnetron sputtering where very large ion currents are produced causing a very intense and localized heating of the target.

Various means have been used in the past for holding sputter targets in place within the sputter sources. Commercially available sputter coating target cathodes today are either bonded directly to the cathode assembly or secured using various mechanical means. The method used to attach the sputter target to the cathode assembly will also greatly affect the size and overall design of the magnetron sputtering source, the amount of down time when changing targets, and the overall performance of the source. By also eliminating the need for a cooling fluid, the miniaturization of the magnetron sputtering apparatus becomes feasible, and the cost of building the sputtering apparatus becomes more economical.

A co-pending application titled "Magnetically Attached Sputter Targets," by Makowiecki, et al., Ser. No. 07/962,657, filed Oct. 19, 1992, (now U.S. Pat. No. 5,286,361) discloses a novel method and assembly for attaching sputtering targets to cathode assemblies using a magnetically permeable material imbedded in the base portion of the sputter target. Target attachment to the cathode is achieved by virtue of the permanent magnets and/or pole pieces that create magnetic flux lines adjacent to the backing plate, which strongly attract the magnetically permeable material in the target assembly. The magnetically attached sputter target, in conjunction with the present invention, results in a magnetron sputtering source design that is compact, versatile, and less costly to manufacture and operate than prior art sputtering source designs.

The present invention also features the use of a thermally conductive and electrically insulating washer, which allows the mounting surface to be used as a heat sink, thereby removing the need for supplying (or reducing the amount of) cooling fluid to the sputtering source. This eliminates (or decreases the number of) cooling channels in the cathode assembly, thereby resulting in a more compact sputtering source design.

Further, the present invention also features a design that allows for a miniature and compact magnetron sputtering source. Greater flexibility is obtained when several small sources are used in an array instead of a larger single source. Precise control of the sputter coating thickness can be extended to virtually any size or shape surface by simply reconfiguring the arrangement of small sources in the array. In addition to process control and flexibility, the concept of using several small sources in an array also offers substantial cost savings in both fabrication and operation.

Furthermore, the present invention also features a small source design that does not require vacuum sealing. Eliminating the vacuum seal between the source and the sputtering chamber reduces the number of potential leak sites in the system.

U.S. Pat. No. 4,204,936 discloses a method and apparatus for attaching a target to the cathode of a sputtering system using a ferromagnetic retainer that is not incorporated in the sputter target assembly. Consequently, the retainer must be positioned on the sputtering surface of the target to allow it to clamp the target against the backing plate of the cathode assembly. The location of the retainer is in close proximity to the erosion area of the target. This degrades the operating characteristics of the sputtering apparatus by potentially allowing the retainer material to be sputtered away with the target material, thereby contaminating the substrate being coated. The patent also discloses a sputtering apparatus requiring the use of water passageways to remove heat from the cathode assembly. Heat transfer is further assisted by the use of thermally conductive liquid metals between the target and the backing plate.

U.S. Pat. No. 4,392,939 teaches a magnetron sputtering cathode design where the target is held against the backing plate by a vacuum, enabling the backing plate to be reused. The design is complicated in that close tolerances must be maintained to insure a strong vacuum seal between the target and the backing plate. The backing plate is water cooled and heat transfer is further assisted by the use of a molten solder between the target and the backing plate which adheres to the backing plate but not to the target. The design is not versatile, the vacuum channels are costly to machine into the backing plate, and the addition of a vacuum system increase the overall cost of building the apparatus. The inefficiency of the design is realized by the fact that the many channels required for achieving a good vacuum result in reducing the interfacial contact between the target and the backing plate. The design tries to compensate for this by using a selectively adhering molten metal to regain the thermal contact lost by the channels.

U.S. Pat. No. 4,417,968 discloses a cylindrical magnetron sputtering apparatus design for coating a large number of substrates. The design is very complex, bulky, costly to fabricate and to maintain. Heat transfer from the cathode assembly is facilitated by a set of water channels located inside the cylindrical cathode.

U.S. Pat. No. 4,421,628 shows a rectangular target design for cathode sputtering apparatus. The target is held in place by screws, located around the perimeter and in a groove centrally located in the face of the target, that thread into the backing plate. The simple mechanical design makes changing targets easy; however, the fact that screws are located at the sputtering surface near the erosion area offers a potential source for contamination.

U.S. Pat. No. 4,761,218 discloses a sputtering source with plural target rings that are individually controlled to adjust the erosion regions of the targets for coating large substrates and/or substrates of different shapes. The system requires that cooling fluid be injected into the cathode assemblies to carry heat away from the sources. Although the design does offer some versatility, its use is primarily for coating large substrates. The design is inherently complex and costly as each target ring requires a separate power supply and controller.

U.S. Pat. Nos. 4,049,533; 4,183,797; and 4,812,217 disclose ion sputtering devices for producing coatings or films. The devices comprise a plurality of vacuum chambers and pairs of target cathodes arranged opposite each other. The designs are complicated and considerable assembly and disassembly time are required to change targets. The designs are not versatile and their manufacture is costly.

U.S. Pat. No. 4,915,805 shows a hollow cathode magnetron sputtering apparatus for simultaneously sputter coating a substrate on both sides using two planar magnetrons. Cooling is accomplished by coolant tubes interspersed between the magnets and the target material in the cathode assembly. The design is complex and the cooling assembly is costly to fabricate. Further, the complexity of the design makes miniaturization difficult.

U.S. Pat. No. 5,009,765 teaches a sputter target design where the sputter target is welded to the backing plate. The backing plate is machined to provide for a bayonet mount to the corresponding cathode assembly. With this design, both the target and the backing plate materials must be discarded at the end of the target's life. The welded target plus backing plate assembly has a large cavity directly behind the target that acts as a reservoir for the cooling media to flow through to carry heat away from the assembly. The design is more costly as the backing plate must be discarded with the expended target. The requirement of a large cooling media cavity for heat transfer makes it difficult to use this target assembly in a compact sputtering apparatus design.

U.S. Pat. No. 5,021,139 teaches a cathode sputtering apparatus design with an improved cooling method that uses expandable cooling channels. The design uses a rectangular coolant channel that presses against the target and the backing plate to improve the conduction of heat away from the source. The size of the cooling channel is large relative to the size of the cathode assembly making miniaturization difficult. The cathode design is simple; however, the coolant channel itself requires a plurality of beads or folds that extend along the channel to allow the channel to change dimensionally under coolant pressure. The fabrication of the channels, consequently, adds considerable cost to the design.

U.S. Pat. No. 5,022,978 shows a sputtering apparatus for coating three dimensional articles where the article is rotated in the presence of a rectangular magnetron cathode. The target and the backing plate appear to be brazed together with coolant channels running through the backing plate-permanent magnet assembly. The joining of the target to the backing plate (containing the permanent magnets) causes the whole subassembly to be expended after the target expires. This adds considerable cost to the replacement of the target.

Several other designs that employ the circulation of cooling media directly through the backing plate located adjacent to the sputter target have been conceived. In some cases, the thermal contact between the target and the cooling wall are maintained by the thermal expansion of the target against the cooling wall. Examples of such sources are shown in U.S. Pat. Nos. 4,100,055; 4,385,979; 4,457,825; and 4,657,654. The use of a material's thermal expansion alone, however, is not an efficient way to maintain good thermal contact between the target and the cathode assembly. Because expansion is a function of temperature, differences in contact pressure are realized at different operating temperatures. This reduces the versatility of such designs and can introduce substantial degradation in the systems ability to efficiently carry heat away from the target under different operating conditions.

From the prior art it is recognized that all magnetron sputtering sources have four basic design features. First, they all contain a directly cooled and electrically isolated cathode assembly that supports the sputter target and contains the permanent magnet assembly.

Second, a ceramic or polymer insulator electrically isolates the cathode assembly from ground. The insulator structure also establishes the vacuum compatibility of the source by way of ceramic-to-metal braze joints or elastomer O-ring seals.

Third, only a portion of the power in the sputtering process is consumed by ejecting near surface atoms by ion bombardment. Most of the power contributes to thermal heating of the sputter target and the cathode assembly. The excess heat generated is removed by circulating water or another cooling media in the cathode assembly.

Fourth, the sputtering process should be confined to the target surface by using sputter shields that prevent all other exposed surfaces of the cathode assembly and/or target attachment hardware from also being sputtered. This is a necessary requirement if contamination is to be avoided.

SUMMARY OF THE INVENTION

The present invention discloses two basic magnetron sputtering source designs that are closely related. The first is a small source design that does not require direct cooling nor vacuum sealing and the second is a larger source design that uses a novel target loading and removal apparatus that is an integral part of the source design.

The small magnetron sputtering source design of the present invention has an electrically isolated cathode assembly that supports the sputter target; however, it does not use a ceramic or polymer insulator to establish vacuum compatibility. It does not require direct circulation of cooling media in the cathode assembly and it does not need grounded sputtering shields in the direct current mode to confine the sputtering process to the sputter target. Consequently, this design is more compact with fewer components, easier to fabricate, and less costly than prior art sources.

The small source has a novel thermal design that allows the heat generated in the sputtering process to be removed by a solid metal conductor bonded to the magnet assembly, which can be attached to any cooled flat surface in the vacuum chamber via a thin ceramic or polymer electrical insulator. The heat transfer with this design is so effective that the requirement for direct cooling in the cathode assembly is removed.

Furthermore, the performance achieved with the small source design is better than that obtained from larger sources because the distance between the target surface and the permanent magnet assembly is reduced. This enables the use of a thicker sputter target or a lower cathode potential.

The larger source design is conceptually similar to the small source design with some minor modifications. The larger design provides for retrofitting the present invention to most commercial sputtering apparatus used today. Although the small source has definite advantages in performance, economy, and versatility, the extension of the design concept to larger sources expands the potential application of the present invention to most commercial vacuum coating operations, while maintaining the performance, cost, and flexibility benefits it derives.

In the small source a separate ceramic washer is used both to transfer heat and to electrically isolate the sputtering source. The mechanical properties of the ceramic material (e.g., its thermal expansion and strength) limits the design to diameters less than a few inches. Uniform compression of the ceramic washer is essential for proper performance of the sputtering source. This requirement posses a practical limit to the washer diameter, and in turn to the diameter of the magnetron sputtering source.

This limitation is overcome in the present invention by bonding a thermally conductive and electrically insulating ceramic washer into the metal conductor. The metal conductor, with the larger source design, can optionally have a cooling channel for circulating a cooling fluid through the cathode assembly.

Another problem associated with scaling up the small source design involves the magnetically attached sputter target. As the diameter of the source is increased the size of the permanent magnets and the magnetic field strength increases. Also, the force required to magnetically attach the sputter target must increase to compensate for the increase in contact area between the metal conductor. As the magnetic field increases, the target attaching operation can become dangerous to the operator or damaging to the source.

The present invention eliminates this problem by using a modified outer sputtering shield design that simplifies the attachment and removal of larger source targets.

Accordingly, it is an object of this invention to provide a magnetron sputtering source design for a simple, low cost, high performance, miniature and compact sputtering source.

Another object of this invention is to provide a magnetron sputtering source design that incorporates a magnetically attached sputter target on the cathode assembly that can be quickly, safely, and cost-effectively installed and removed.

Another object of this invention is to provide a magnetron sputtering source design that offers improved thermal conductivity for removing heat from the sputtering source with or without the assistance of cooling fluid circulation within the cathode assembly.

Another object of this invention is to provide a magnetron sputtering source design that will retrofit most cathode sputtering systems in a cost effective manner.

Another object of this invention is to provide a magnetron sputtering source design that does not require vacuum seals, thereby eliminating pressure leaks attributable to the source.

Other objects and advantages of the invention will be apparent from the following detailed description, the accompanying drawings and the appended claims.

BRIEF DESCRIPTION OF THE DRAWINGS

The various novel features of this invention, along with the foregoing and other objects as well as the invention itself both as to its organization and method of operation, may be more fully understood from the following description of the illustrated embodiments when read in conjunction with the accompanying drawings wherein:

FIG. 3b is an enlarged cross-section view of the bonded metal conductor to ceramic washer assembly of FIG. 3a.

DETAILED DESCRIPTION OF THE INVENTION

Figure 1:
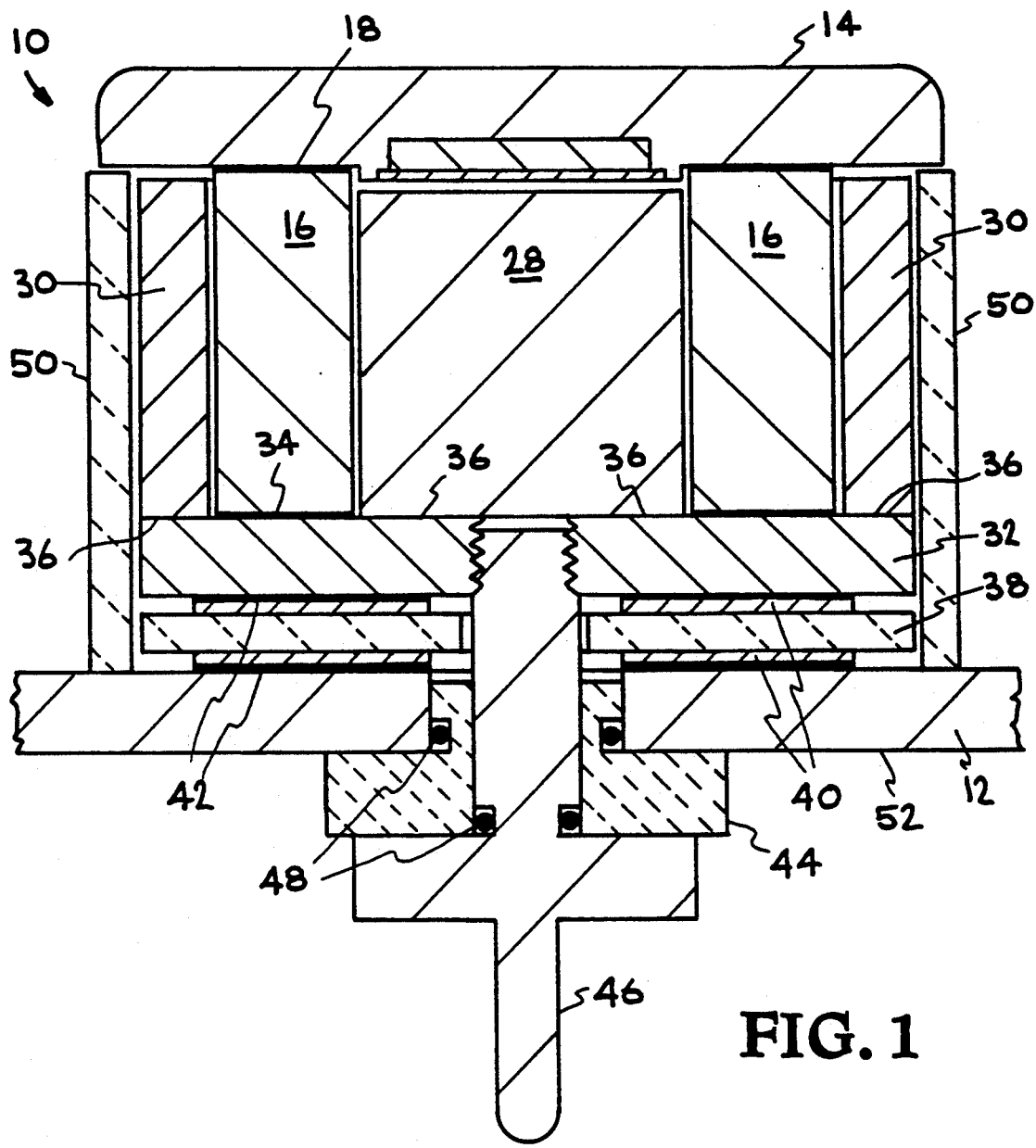
FIG. 1 is a cross-section view of a small magnetron sputtering source design in accordance with the present invention.

Referring to FIG. 1, there is shown a small magnetron sputtering source assembly 10 attached to a mounting plate 12, where the diameter of the small source assembly 10 is typically 3.8 cm (1.5 in) or less. The mounting plate 12 is located inside the vacuum chamber (not shown) of the sputtering apparatus. The preferred materials for the mounting plate are copper and aluminum. Such small sources are ideally suited for research and development activities or for use in arrays for coating any size or shape surface. The small source assembly 10 has a magnetically attached sputter target assembly 14 that rests upon a metal conductor ring 16. The preferred material for the metal conductor ring 16 is copper and the addition of a thermal paste 18 between the target assembly 14 and the conductor ring 16 can be used to improve thermal contact.

Figure 2:
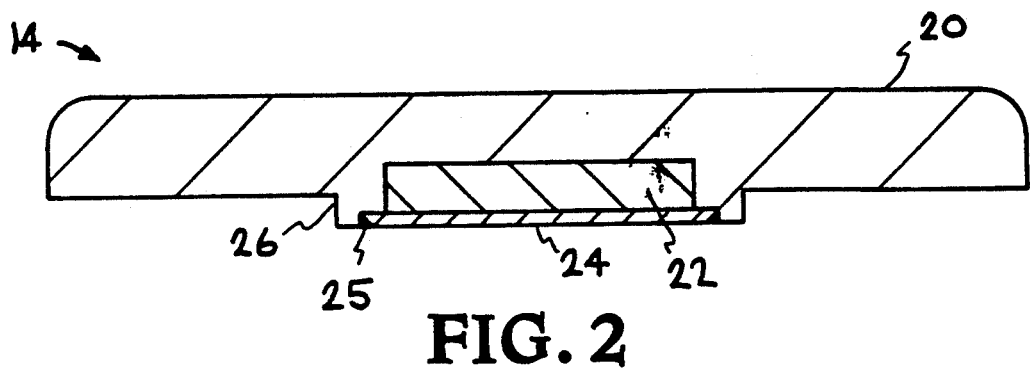
FIG. 2 is an enlarged cross-section view of a target cathode with magnetic attachment means used in the magnetron sputtering source design in accordance with the present invention.

Referring now additionally to FIG. 2, the sputter target assembly 14 is comprised of a sputter target material 20 with a magnetically permeable material 22 imbedded in the base portion of the target assembly 14 and held in place there by a cover plate 24 that is welded or crimped 25 to the target assembly 14. The target material 20 may be composed of aluminum, copper, gold, silver, boron, carbon, ceramics, and glass. The target assembly 14 is geometrically configured with a step 26 to allow for proper alignment of the target assembly 14 on the conductor ring 16 of the small magnetron source 10. The target assembly 14 is held in place on the small source 10 by the magnetically permeable material 22 which is attracted by the magnetic field imposed by the inner permanent core magnet 28, the outer magnet ring 30, and the threaded pole piece 32. The preferred material for the inner core magnet 28 and the outer ring magnet 30 is neodymium-iron-boron. The preferred materials for the pole piece 32 are vanadium permendur and steel permendur, but may be made from carbon steel or iron. The conductor ring 16 is bonded to the pole piece 32 by a high-temperature vacuum braze 34, while the inner core magnet 28 and the outer ring magnet 30 are magnetically attached at junction 36 to the pole piece 32. The preferred braze 34 is a silver-copper alloy solder, but silver alloys may be used.

A thermally conductive and electrically insulating ceramic washer 38, that has a metallized coating 40 on its upper and lower surfaces, is sandwiched between the pole piece 32 and the mounting plate 12. The preferred material for the ceramic washer 38 is aluminum nitride. The preferred materials for the metallized coating 40 are copper and aluminum. The addition of a thermal paste 42 can optionally be used to improve thermal contact between the pole piece 32, metal coated ceramic washer 38, and the mounting plate 12.

A ceramic insulator 44 is used to electrically insolate the threaded power feedthrough 46 from the mounting plate 12. The preferred material for the ceramic insulator 44 is aluminum oxide and the preferred material for the power feedthrough 46 is stainless steel. However, the insulator 44 may also be made of mullite, fused silica, and glasses. Optional vacuum seals 48 can be used between the ceramic insulator 44 and the power feedthrough 46 and between the ceramic insulator 44 and the mounting plate 12 when the small source assembly 10 is mounted such that the mounting plate 12 is formed from the wall of the vacuum chamber (not shown). Typically, however, the small source 10 is mounted on a mounting plate 12 within the confines of the vacuum chamber (not shown) and the vacuum seals 48 are not required.

A ceramic sputter shield 50 surrounds the internal components of the small source assembly 10. It is held in place, as shown, by the lip of the target assembly 14 and the mounting plate 12. The preferred material for the ceramic sputter shield 50 is aluminum oxide. The ceramic sputter shield 50 can also be held in place with angular brackets (not shown) that mechanically fasten the sputter shield 50 to the mounting plate 12.

Circulation of a cooling fluid through the small source assembly 10 is not required with the design of the present invention illustrated in FIG. 1. Instead, the existence of a cooled surface 52 on the mounting plate 12 is used. If the freely exposed surface area of the cooled surface 52 is large relative to the interfacial contact area between the metal coated ceramic washer 38 and the mounting plate 12, then radiant heat transfer into the vacuum will be adequate to keep the small source assembly 10 from overheating.

Figure 3A:
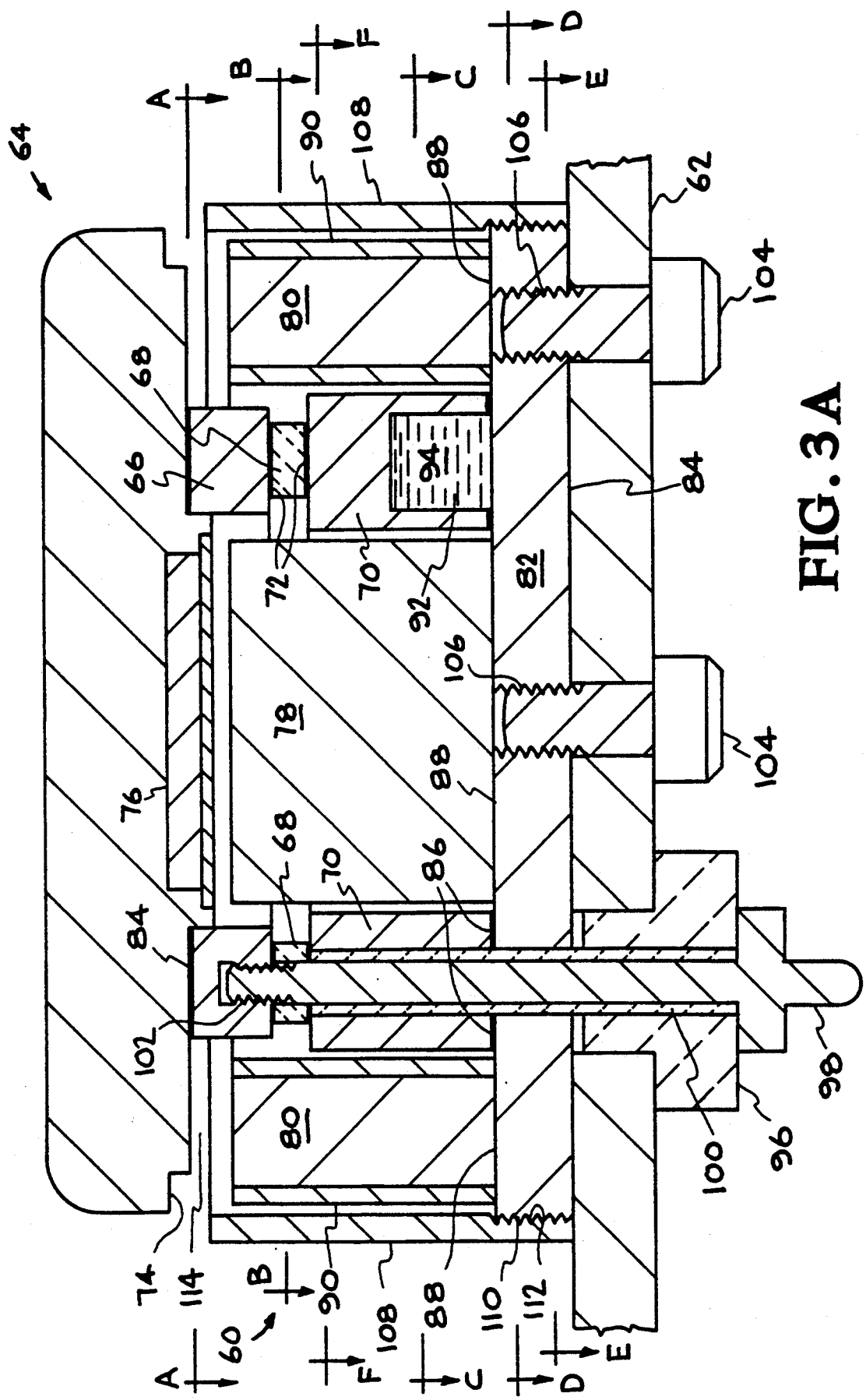
FIG. 3a is a cross-section view of a larger magnetron sputtering source design in accordance with the present invention.

Referring now to FIG. 3a, there is shown a larger magnetron sputtering source assembly 60 attached to a mounting plate 62, where the diameter of the larger source assembly 60 is typically 15.2 cm (6.0 in) or less. The mounting plate 62 is located inside the vacuum chamber (not shown) of the sputtering apparatus. The preferred materials for the mounting plate 62 are copper and aluminum. These larger sources are best suited for incorporating the benefits of the present invention into many of today's existing sputtering apparatuses. The larger source is used most frequently for commercial coating operations.

The larger source assembly 60 has a magnetically attached sputter target assembly 64 that rests upon a thermal conductor assembly consisting of an upper thermally conductive cylindrical ring 66, a thermally conductive and electrically insulating ceramic washer 68, and a fluid cooled lower thermally conductive cylindrical ring 70. The preferred material for the ceramic washer 68 is aluminum nitride. The preferred material for the upper thermally conductive cylindrical ring 66 and the lower thermally conductive cylindrical ring 70 is copper.

Figure 3B:
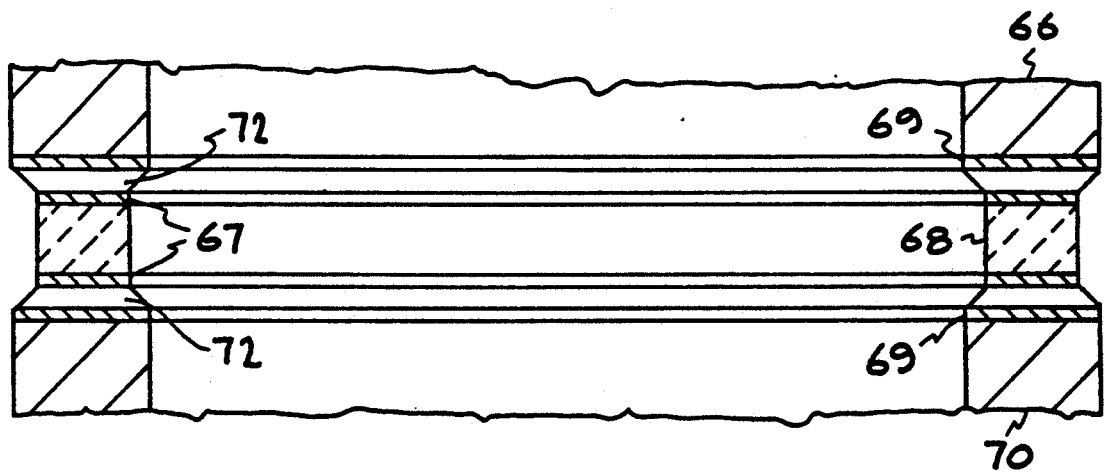

Referring now additionally to FIG. 3b, an enlarged view of the conductive cylindrical rings 66 and 70 and the ceramic washer 68 are shown. The ceramic washer 68 is metallized with a thin adhesion layer 67 of titanium on both the top and bottom surfaces. The mating surfaces of the upper thermally conductive cylindrical ring 66 and the lower thermally conductive cylindrical ring 70 are metallized with a thin adhesion layer 69 of silver. The preferred method for applying the thin titanium adhesion layer 67 and thin silver adhesion layer 69 is vacuum sputter coating. The titanium metallized ceramic washer 68 is bonded to the silver metallized upper thermally conductive cylindrical ring 66 and the silver metallized lower thermally conductive cylindrical ring 70 with a low-temperature solder 72. The preferred low-temperature solder 72 is tin or a tin alloy foil that is typically 2 mils thick. The preferred environment for applying the solder is a vacuum as the use of a flux is typically not required. The thin titanium adhesion layer 67 on the ceramic washer 68 and the thin silver adhesion layer 69 on the mating surfaces of the upper thermally conductive cylindrical ring 66 and the lower thermally conductive cylindrical ring 70 make adhesion of the low-temperature solder 72 stronger.

The target assembly 64 is similar to that shown in FIG. 2, with the exception that a mounting step 74 has been machined into the target assembly 64. The addition of a thermal paste 84 between the target assembly 64 and the upper thermally conductive cylindrical ring 66 can be used to improve thermal contact. A cooling channel 92 is located inside the lower thermally conductive cylindrical ring 70 for the purpose of circulating a cooling fluid 94 to help remove heat from the larger source assembly 60 during operation.

The target assembly 64 is held in place on the larger source 60 by the magnetically permeable material 76 (imbedded in the target assembly 64) which is attracted by the magnetic field imposed by the inner permanent core magnet 78, the outer ring of permanent magnets 80, and the threaded pole piece 82. The preferred material for the inner core magnet 78 and outer ring of magnets 80 is neodymium-iron-boron. The preferred materials for the pole piece 82 are vanadium permendur and steel permendur. The lower thermally conductive cylindrical ring 70 is bonded to the pole piece 82 by a high-temperature vacuum braze 86. The preferred braze 86 is a silver-copper alloy solder. The inner core magnet 78 and the outer ring of magnets 80 are magnetically attached at junction 88 to the pole piece 82. The outer ring of magnets are contained in an outer magnet ring holder 90. The preferred material for the outer magnet ring holder 90 is aluminum.

A ceramic insulator 96 is used to electrically isolate the threaded power feedthrough 98 from the mounting plate 62. The preferred material for the ceramic insulator 96 is aluminum oxide and the preferred material for the power feedthrough 98 through is stainless steel. The power feedthrough 98 is also isolated from the pole piece 82, the liquid cooled lower thermally conductive cylindrical ring 70, and the ceramic washer 68 by a ceramic insulating tube 100. The preferred material for the ceramic insulating tube 100 is aluminum oxide. The power feedthrough 98 is mechanically fastened to the upper thermally conductive cylindrical ring 66 by a threaded mount 102.

Attachment of the larger source assembly 60 to the mounting plate 62 is partially accomplished by the threaded mount 102 of the power feedthrough 98. Additional attachment is also achieved by mounting screws 104 that pass through the mounting plate 62 and are attached to the pole piece 82 by threaded mounts 106. Optional vacuum seals (not shown) can also be fitted in the power feedthrough 98 and in the mounting screws 104 to provide vacuum sealing when the larger source 60 is mounted directly to the wall of the vacuum chamber (not shown).

With the larger source 60, a metal sputter shield 108 surrounds the internal components of the assembly. The metal sputter shield 108 is also a key part of the present invention in that it also serves as a means for aligning, mounting and removing the sputter target assembly 64. The preferred materials for the metal sputter shield 108 are stainless steel and aluminum. Mounting is accomplished by placing the mounting step 74 of the target assembly 64 on the top edge of the sputter shield 108 and then screwing the threaded lower portion 110 of the sputter shield 108 onto the threaded outer portion 112 of the pole piece 82. When the bottom edge of the sputter shield 108 contacts the surface of the mounting plate 62, the target assembly 64 will be correctly positioned on the large source 60. Removal is accomplished by reversing the above steps. The number of threads on the threaded lower portion 110 of the sputter shield 108 will depend on the size of the larger source 60. Because larger target assemblies 64 will generate larger attractive forces, making attachment and removal more difficult (and more dangerous), a greater number of threads will be needed than for a comparable source with a smaller target assembly 64. Because the sputter shield 108 continues to thread down around the larger source assembly 60 after the target assembly 64 has mated with the upper thermally conductive cylindrical ring 66, an insulating gap 114 is created between the target assembly 64 and the sputter shield 108, outer ring of magnets 80, outer magnet ring holder 90, and inner core magnet 78. This gap isolates the target assembly 64, which is at potential, from the rest of the components in the larger source 60 which are at ground.

Figure 4:
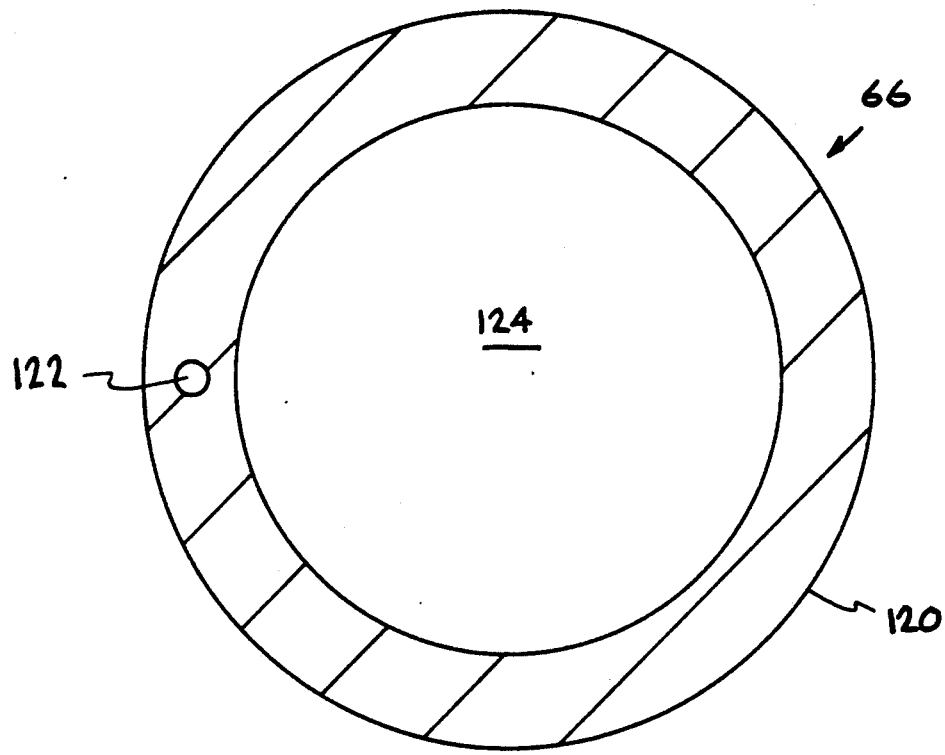
FIG. 4 is a cross-section view of the upper metal conductor taken at lines A—A of FIG. 3a in accordance with the present invention.

Referring now to FIG. 4, a cross-section view of the upper thermally conductive cylindrical ring 66 is shown perpendicular to its view in FIG. 3a. The upper thermally conductive cylindrical ring 66 is made from a high thermal conductivity metal tube 120, preferably copper, that has a threaded hole 122 for receiving the power feedthrough (shown in FIG. 3a). An inner cavity 124 is provided for the inner core magnet (shown in FIG. 3a).

Figure 5:
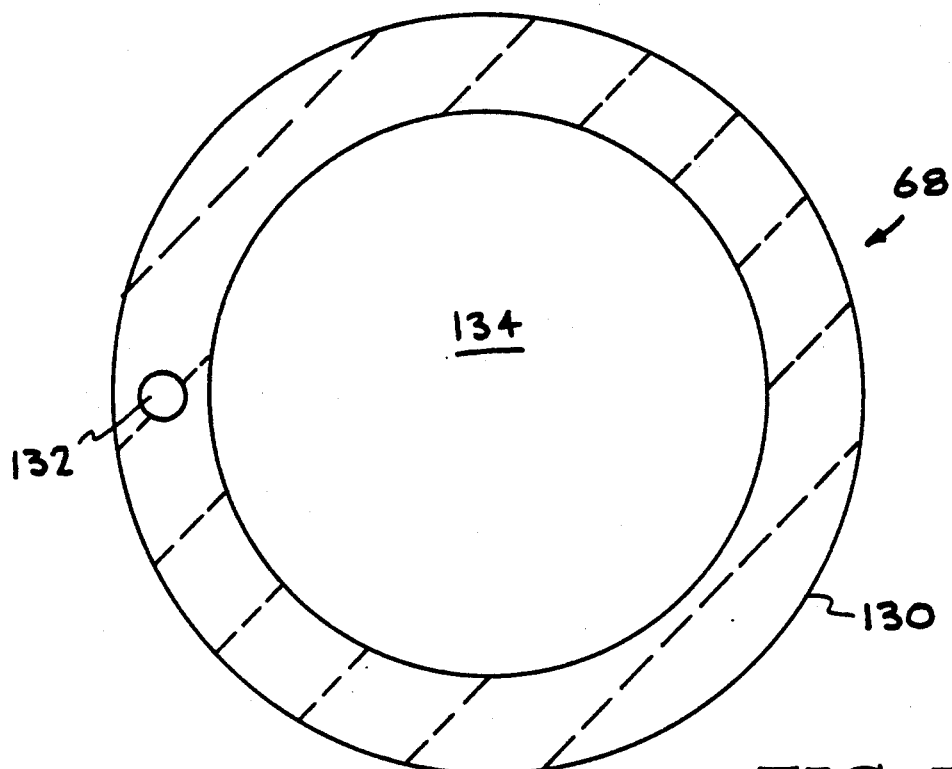
FIG. 5 is a cross-section view of the thermally conductive and electrically insulating ceramic washer taken at lines B—B of FIG. 3a in accordance with the present invention.

Referring now to FIG. 5, a cross-section view of the ceramic washer 68 is shown perpendicular to its view in FIG. 3a. The ceramic washer 68 is made from a thermally conductive and electrically insulating ceramic disk 130, preferably aluminum nitride, that has a smooth hole 132 for receiving the ceramic insulating tube and power feedthrough (shown in FIG. 3a). An inner cavity 134 is also provided for the inner core magnet (shown in FIG. 3a).

Figure 6:
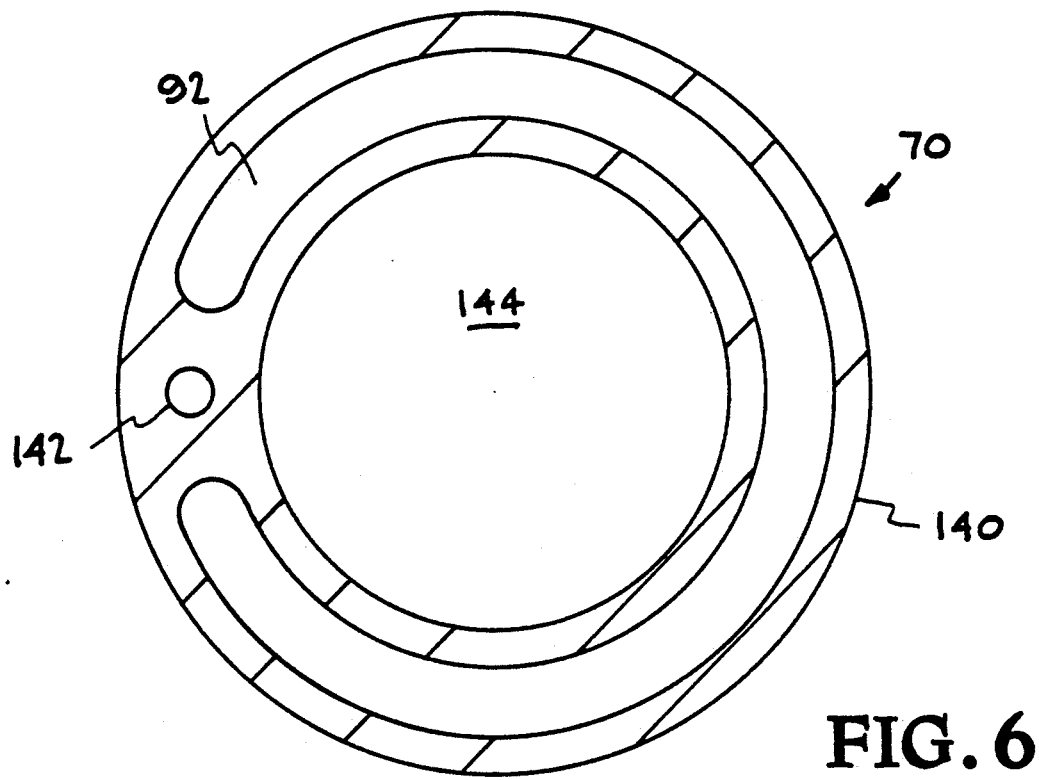
FIG. 6 is a cross-section view of the lower metal conductor, with a cooling channel, taken at lines C—C of FIG. 3a in accordance with the present invention.

Referring now to FIG. 6, a cross-section view of the lower thermally conductive cylindrical ring 70 is shown perpendicular to its view in FIG. 3a. The lower thermally conductive cylindrical ring 70 is cooled by circulating a cooling fluid through a cooling channel 92. The lower thermally conductive cylindrical ring is made from a high thermal conductivity metal tube 140, preferably copper, that has a smooth hole 142 for receiving the ceramic insulating tube and power feedthrough (shown in FIG. 3a). An inner cavity 144 is also provided for the inner core magnet (shown in FIG. 3a).

Figure 7:
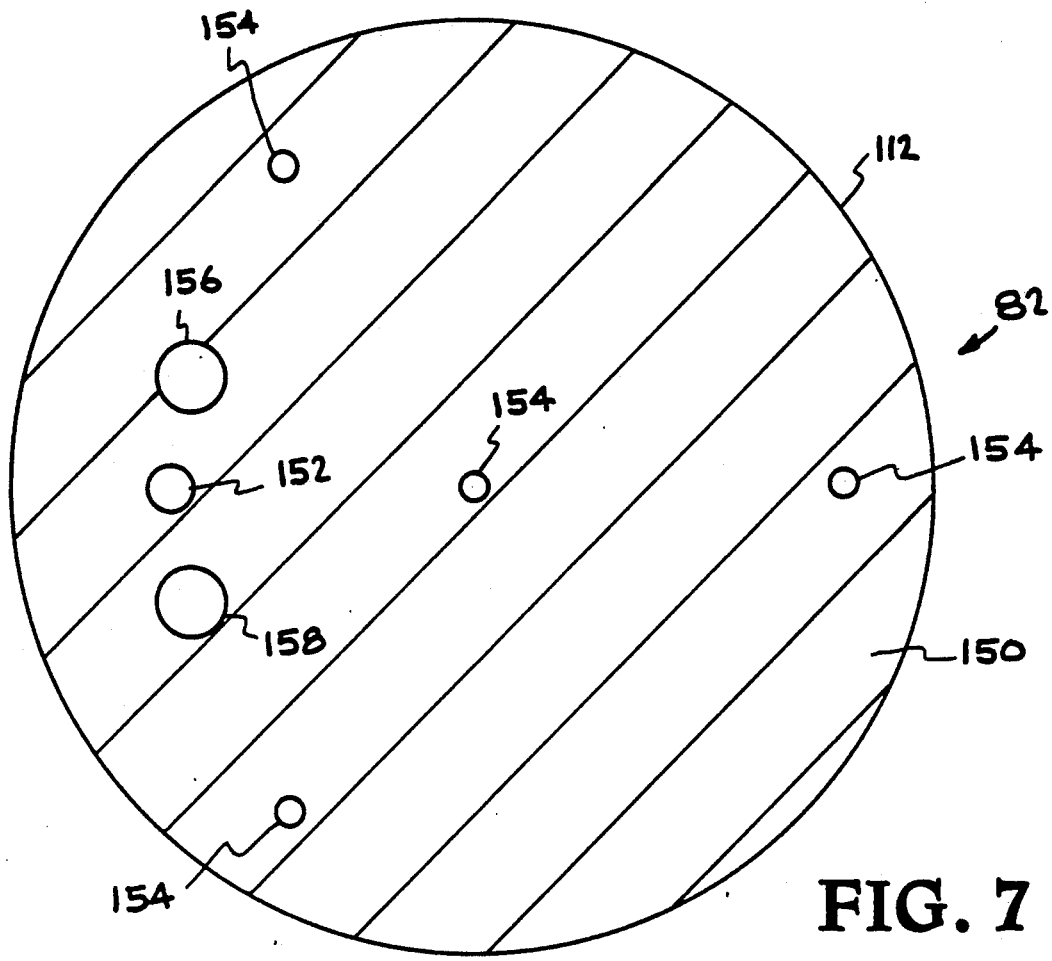
FIG. 7 is a cross-section view of the pole piece plate taken at line D—D of FIG. 3a in accordance with the present invention.

Referring now to FIG. 7, a cross-section view of the pole piece 82 is shown perpendicular to its view in FIG. 3a. The pole piece 82 is made from a magnetically permeable disk 150, preferably vanadium permendur or steel permendur, that has a smooth hole 152 for receiving the ceramic insulating tube and power feedthrough (shown in FIG. 3a). Threaded holes 154 are used to receive four mounting screws for attachment to the mounting plate (shown in FIG. 3a). An inlet 156 and outlet 158 are present to allow the entry and the exit of a cooling fluid. The pole piece 82 is threaded around its perimeter, providing a threaded outer portion 112 for mating with the threaded lower portion of the sputter shield (shown in FIGS. 3, 8, and 9).

Figure 8:
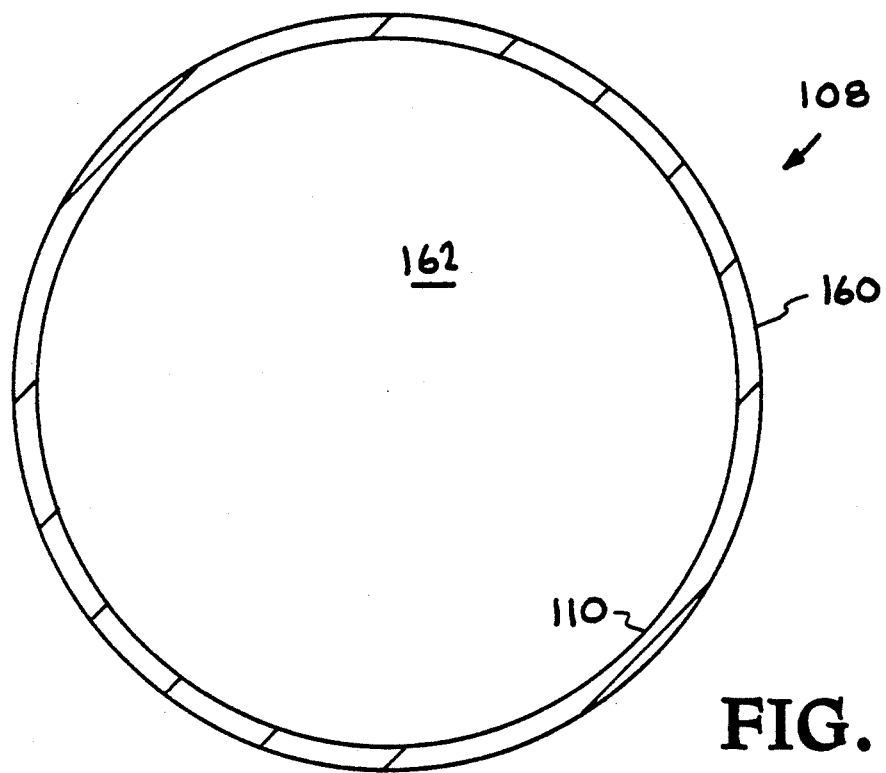
FIG. 8 is a cross-section view of the outer sputter shield taken at line E—E of FIG. 3a in accordance with the present invention.
Figure 9:
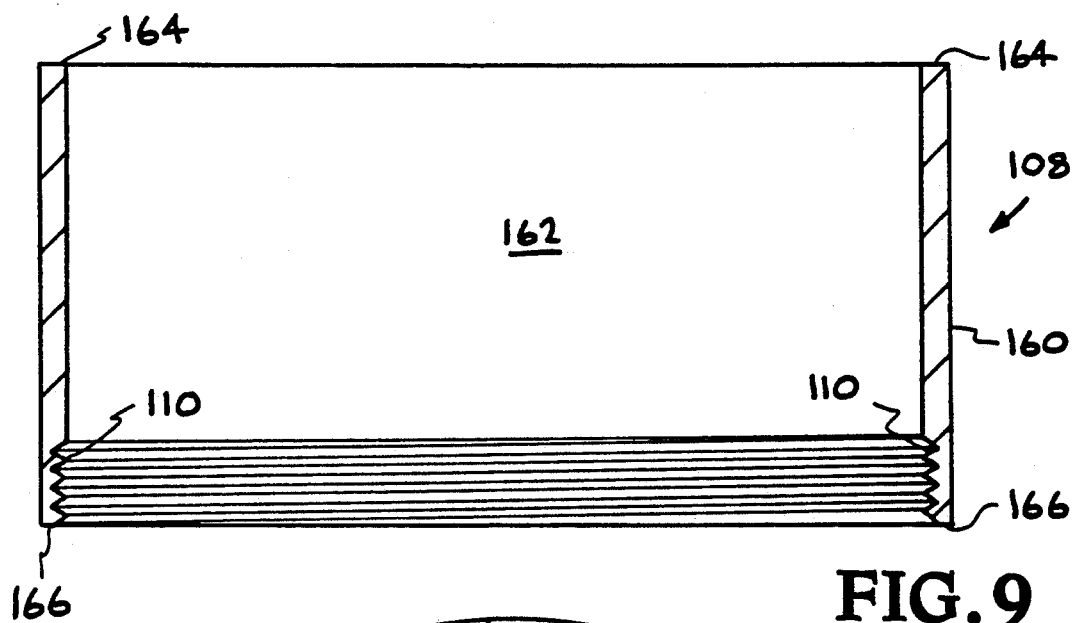
FIG. 9 is a cross-section view of the outer sputter shield taken at line E—E of FIG. 8 in accordance with the present invention.

Referring now to FIG. 8, a cross-section view of the sputter shield 108 is shown perpendicular to its view in FIG. 3a. Referring additionally to FIG. 9, a cross-section view of the sputter shield 108 is shown perpendicular to its view in FIG. 8. The sputter shield is made from a high stiffness metal tube 160, preferably stainless steel or aluminum, with a larger inner cavity 162 for surrounding the internal components of the source (shown in FIG. 3a). The sputter shield is threaded along the lower inner portion of its perimeter, providing a threaded lower portion 110 of the sputter shield 108 for mating with the threaded outer portion pole piece (shown in FIGS. 3 and 7). During target installation and removal the sputter shield upper edge 164 provides a means for supporting the target assembly (shown in FIG. 3) and the sputter shield lower edge 166 provides a means for stopping the sputter shield against the mounting plate (shown in FIG. 3).

Figure 10:
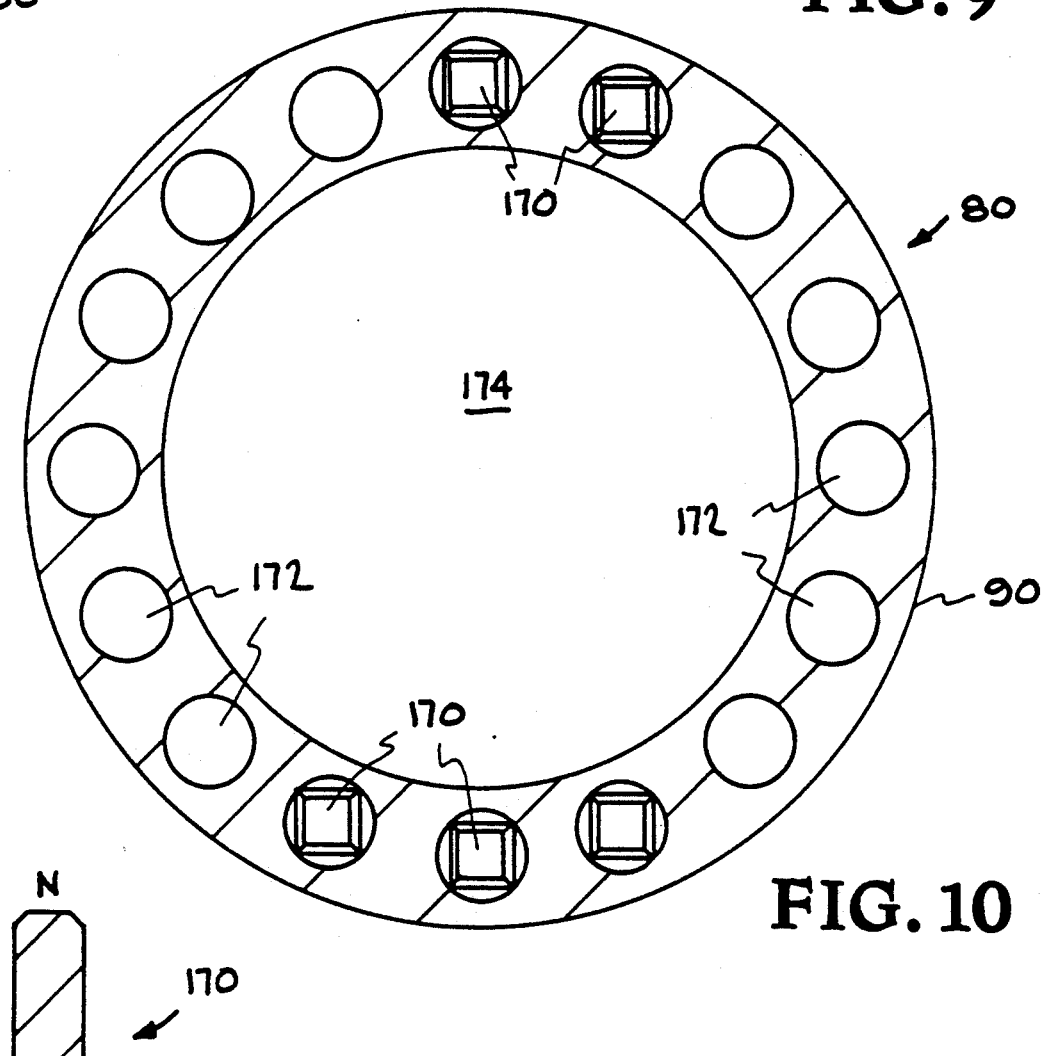
FIG. 10 is a cross-section view of the outer ring of permanent magnets taken at lines F—F of FIG. 3a in accordance with the present invention.

Referring now to FIG. 10, a cross-section view of the outer ring of permanent magnets 80 is shown perpendicular to its view in FIG. 3a. The outer ring of permanent magnets 80 is comprised of a set of several permanent magnets 170 located circumferentially around an outer magnet ring holder 90 that is made from a non-metallic metal, preferably aluminum. Each magnet 170 is sealed in a cavity 172 in the outer magnet ring holder 90. An inner cavity 174 is also provided for the inner core magnet and conductor ring assembly (shown in FIG. 3a).

Figure 11:
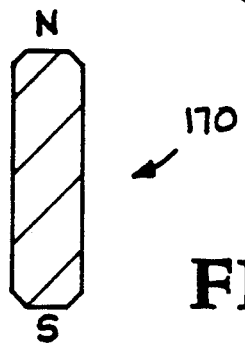
FIG. 11 is a cross-section view of one of the permanent magnets contained in the outer ring of permanent magnets taken at line G—G of FIG. 10 in accordance with the present invention.

Referring now to FIG. 11, a cross-section view of one of the permanent magnets 170 is shown perpendicular to its view in FIG. 10. The permanent magnet 170 is made from a rare earth magnetic composition, preferably neodymium-iron-boron.

The present invention is superior over other sputtering apparatus in that it offers a simple design with improved operating characteristics that does not necessarily require direct liquid cooling nor vacuum sealing and which is compact, versatile, and can be manufactured at a low cost.

While this invention has been described with reference to several preferred embodiments, its is contemplated that various alterations and modifications thereof will become apparent to those skilled in the art upon a reading of the preceding detailed description. It is therefore intended that the following appended claims be interpreted as including all such alterations and modifications as fall within the true spirit and scope of this invention.

We claim:

1. A magnetron sputtering source for coating substrates, comprising:
   a sputter target assembly;
   a magnetically permeable material contained in said sputter target assembly;
   a mounting plate;
   a magnetically permeable pole piece located parallel to said mounting plate;
   a cylindrical inner core permanent magnet centrally supported and magnetically attached to said magnetically permeable pole piece;
   a cylindrical outer permanent magnet ring surrounding said cylindrical inner core permanent magnet supported and magnetically attached to said magnetically permeable pole piece;
   wherein said sputter target assembly is positioned adjacent said cylindrical outer permanent magnet ring and retained by magnetic attraction between the magnetically permeable material in said target and the pole piece, inner core magnet, and outer cylindrical permanent magnet ring;
   a thermally conductive cylindrical ring located between said inner core permanent magnet and said cylindrical outer permanent magnet ring;
   a thermally conductive electrically insulating ceramic washer disposed between said sputter target assembly and said mounting plate;
   wherein said ceramic washer, thermally conductive cylindrical ring, pole piece and mounting plate constitute a heat conduction means to conduct heat away from said sputter target assembly and electrically insulate the sputter target assembly from said mounting plate;
   a sputter shield surrounding said cylindrical outer permanent magnet ring, said magnetically permeable pole piece, and said ceramic washer, and in contact with said mounting plate;
   a threaded power feedthrough for energizing said sputter target assembly with an electrical current and for attaching the pole piece to the mounting plate; and
   an electrical insulator located between said power feedthrough and said mounting plate for insulating the power feedthrough from the mounting plate.

2. The magnetron sputtering source of claim 1, wherein said sputter target assembly includes geometrically compatible steps formed in the sputter target assembly that align with at least said thermally conductive cylindrical ring to provide a means for aligning the sputter target assembly on the thermally conductive cylindrical ring.

3. The magnetron sputtering source of claim 1, wherein said sputter target assembly includes a sputtering material selected from the group consisting of aluminum, copper, gold, silver, boron, carbon, ceramics, and glasses.

4. The magnetron sputtering source of claim 1, wherein said cylindrical inner permanent core magnet and said cylindrical outer permanent magnet ring are formed of a rare earth magnetic material.

5. The magnetron sputtering source of claim 4, wherein said rare earth magnetic material is a mixture of neodymium, iron, and boron.

6. The magnetron sputtering source of claim 1, wherein said cylindrical outer permanent magnet ring further comprises a nonmagnetic outer magnet ring holder and several separate permanent magnets held therein.

7. The magnetron sputtering source of claim 6, wherein said nonmagnetic outer magnet ring holder is formed of aluminum.

8. The magnetron sputtering source of claim 1, wherein said magnetically permeable pole piece is formed of a material selected from the group consisting of vanadium permendur, steel permendur, carbon steel, and iron.

9. The magnetron sputtering source of claim 1, wherein said thermally conductive cylindrical ring is made of copper.

10. The magnetron sputtering source of claim 1, wherein said thermally conductive electrically insulating ceramic washer is made of aluminum nitride.

11. The magnetron sputtering source of claim 1, wherein said mounting plate is made of a high thermal conductivity metal selected from the group consisting of aluminum and copper.

12. The magnetron sputtering source of claim 1, wherein said electrical insulator is a ceramic material selected from the group consisting of aluminum oxide, mullite, fused silica, and glasses.

13. The magnetron sputtering source of claim 1, wherein said power feedthrough is made of stainless steel.

14. The magnetron sputtering source of claim 1, wherein said mounting plate is a wall of a vacuum chamber of a sputtering system.

15. The magnetron sputtering source of claim 14, further comprising an o-ring or gasket between said power feedthrough and said electrical insulator and between said electrical insulator and said wall of the vacuum chamber to provide a means for vacuum sealing.

16. The magnetron sputtering source of claim 1, wherein said magnetically permeable pole piece is positioned between a bottom surface of said thermally conductive cylindrical ring and a top surface of said mounting plate, with a top surface of said thermally conductive cylindrical ring in contact with a bottom surface of said sputter target assembly.

17. The magnetron sputtering source of claim 16, wherein said thermally conductive electrically insulating washer is metallized on both sides with a metal selected from the group consisting of titanium, copper and aluminum.

18. The magnetron sputtering source of claim 17, wherein said heat conduction means further comprises a thermal paste between the bottom surface of said sputter target assembly and the top surface of said thermally conductive cylindrical ring, between a bottom surface of said magnetically permeable pole piece and a top surface of said metallized thermally conductive electrically insulating washer, and between a bottom surface of the metallized thermally conductive electrically insulating washer and the top surface of said mounting plate.

19. The magnetron sputtering source of claim 16, wherein said heat conduction means further comprises a high-temperature vacuum braze between the bottom surface of said thermally conductive cylindrical ring and a top surface of said magnetically permeable pole piece.

20. The magnetron sputtering source of claim 19, wherein said high-temperature vacuum braze is a solder selected from the group consisting of silver-copper alloys and silver alloys.

21. The magnetron sputtering source of claim 16, wherein said sputter shield is made of a high stiffness material selected from the group consisting of aluminum oxide, mullite, fused silica, and glasses.

22. The magnetron sputtering source of claim 1, wherein said thermally conductive cylindrical ring comprises an upper thermally conductive cylindrical ring section and a lower thermally conductive cylindrical ring section, and wherein said insulating washer is located between said upper and lower ring sections.

23. The magnetron sputtering source of claim 22, wherein said thermally conductive electrically insulating ceramic washer is positioned between a bottom surface of said upper thermally conductive cylindrical ring and a top surface of said lower thermally conductive cylindrical ring, and with a top surface of said upper cylindrical ring in contact with the bottom surface of said sputter target assembly, and said lower thermally conductive cylindrical ring having a bottom surface in contact with a top surface of said magnetically permeable pole piece which has a bottom surface in contact with the top surface of said mounting plate.

24. The magnetron sputtering apparatus of claim 23, wherein said heat conduction means further comprises means for circulating a cooling fluid through said lower thermally conductive cylindrical ring.

25. The magnetron sputtering apparatus of claim 24, wherein said magnetically permeable pole piece further comprises and inlet and an outlet for circulating a cooling fluid.

26. The magnetron sputtering source of claim 23, wherein said sputter shield is made of a high stiffness material selected from the group consisting of stainless steel and aluminum.

27. The magnetron sputtering source of claim 23, further comprising at least one screw projecting through said mounting plate into reciprocal threads located in said magnetically permeable pole piece for providing an attachment means in addition to said threaded power feedthrough.

28. The magnetron sputtering source of claim 23, wherein said heat conduction means further comprises a thin adhesion layer of titanium formed on both sides of said thermally conductive electrically insulating washer and a thin adhesion layer of silver formed on the bottom surface of said upper thermally conductive cylindrical ring and the top surface of said lower thermally conductive ring.

29. The magnetron sputtering source of claim 28, wherein said heat conduction means further comprises a low-temperature solder between the bottom surface of said titanium coated upper thermally conductive cylindrical ring and the top surface of said silver coated thermally conductive electrically insulating washer and between the bottom surface of the silver coated thermally conductive electrically insulating washer and the top surface of said titanium coated lower thermally conductive cylindrical ring.

30. The magnetron sputtering source of claim 29, wherein said low-temperature solder is a foil about 2 mils thick selected from the group consisting of tin and tin alloys.

31. The magnetron sputtering source of claim 30, wherein said heat conduction means further comprises a thermal paste between the bottom surface of said sputter target assembly and the top surface of said upper thermally conductive cylindrical ring and between the bottom surface of said magnetically permeable pole piece and the top surface of said mounting plate.

32. The magnetron sputtering source of claim 23, wherein said heat conduction means further comprises a high-temperature vacuum braze between the bottom surface of said lower thermally conductive cylindrical ring and the top surface of said magnetically permeable pole piece.

33. The magnetron sputtering source of claim 32, wherein said high-temperature vacuum braze is a solder selected from the group consisting of silver-copper alloys and silver alloys.

34. The magnetron sputtering source of claim 22, wherein said pole piece and said sputter shield are each provided with threads for screwing the sputter shield on and off the pole piece, whereby said sputter target assembly is installed and removed by screwing the sputter shield on and off the pole piece.

35. The magnetron sputtering source of claim 1, further comprising a plurality of said sources arranged in an array configured for coating large and/or complex shaped substrates.

36. The magnetron sputtering source of claim 1, wherein said electrically insulating ceramic washer is located between said pole piece and said mounting plate.

37. The magnetron sputtering source of claim 1, wherein said threaded power feedthrough is screwed into reciprocal threads located on one of said pole piece or said thermally conductive ring.

* * * * *